United States Patent [19]

Sugano

[11] Patent Number: 5,393,398
[45] Date of Patent: Feb. 28, 1995

[54] MAGNETRON SPUTTERING APPARATUS

[75] Inventor: Yukiyasu Sugano, Kanagawa, Japan

[73] Assignee: Sony Corporation, Japan

[21] Appl. No.: 180,789

[22] Filed: Jan. 7, 1994

Related U.S. Application Data

[63] Continuation of Ser. No. 896,366, Jun. 10, 1992, abandoned.

[30] Foreign Application Priority Data

Jun. 19, 1991 [JP] Japan ................... 3-174621

[51] Int. Cl.⁶ ............................................. C23C 14/34
[52] U.S. Cl. ........................... 204/298.11; 204/298.12; 204/192.12
[58] Field of Search ........... 204/192.12, 192.3, 298.06, 204/298.11, 298.19, 298.12

[56] References Cited

U.S. PATENT DOCUMENTS

| | | | |
|---|---|---|---|
| 4,960,072 | 10/1990 | Ohta et al. | 204/298.05 X |
| 4,988,424 | 1/1991 | Woodward et al. | 204/298.11 X |

FOREIGN PATENT DOCUMENTS

| | | | |
|---|---|---|---|
| 0440377 | 8/1991 | European Pat. Off. | 204/298.11 |
| 0067016 | 4/1983 | Japan | 204/298.11 |
| 0243167 | 10/1986 | Japan | 204/298.11 |
| 0007855 | 1/1987 | Japan | 204/298.11 |
| 0017173 | 1/1987 | Japan | 204/298.11 |
| 0274766 | 11/1988 | Japan | 204/298.11 |
| 0310965 | 12/1988 | Japan . | |
| 4187765 | 7/1992 | Japan . | |
| 4187766 | 7/1992 | Japan . | |

OTHER PUBLICATIONS

English Language Abstracts for each Japanese document.

Primary Examiner—Nam Nguyen
Attorney, Agent, or Firm—Ronald P. Kananen

[57] ABSTRACT

A magnetron sputtering apparatus comprises: a wafer holder for holding a wafer thereon; a target holder for holding a target thereon, disposed opposite to the wafer holder; and a particle interceptor for intercepting some of particles ejected from the target, disposed between the wafer holder and the target holder. The diameter of the target is not less than that of the wafer and not greater than a value 1.4 times that of the wafer. Most particles fall on the surface of the wafer at small incidence angles and only few particles impinge and accumulate on the particle interceptor, so that particles deposit in a film of a uniform thickness over the surface of the wafer and are able to fall on the bottom surfaces of contact holes formed in the wafer. In a modification, the particle interceptor is moved in a plane parallel to the surface of the wafer to distribute particles uniformly over the surface of the wafer.

2 Claims, 4 Drawing Sheets

F I G. 2
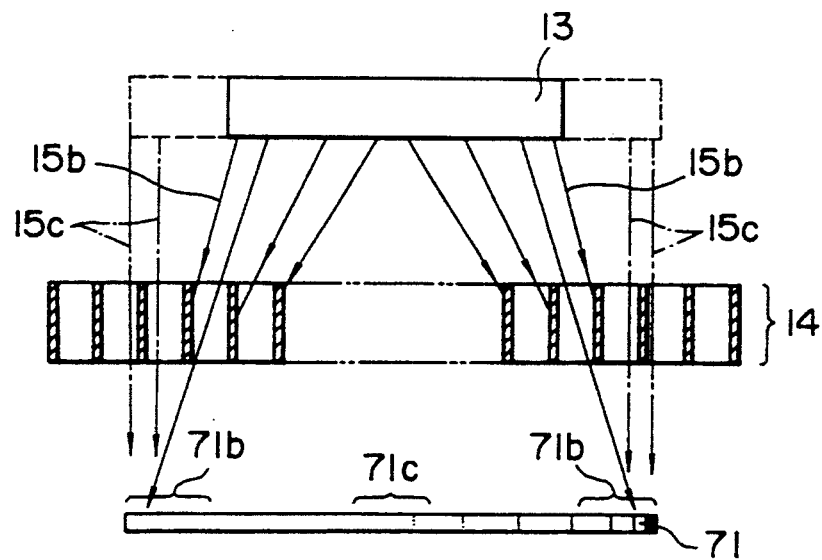
F I G. 3
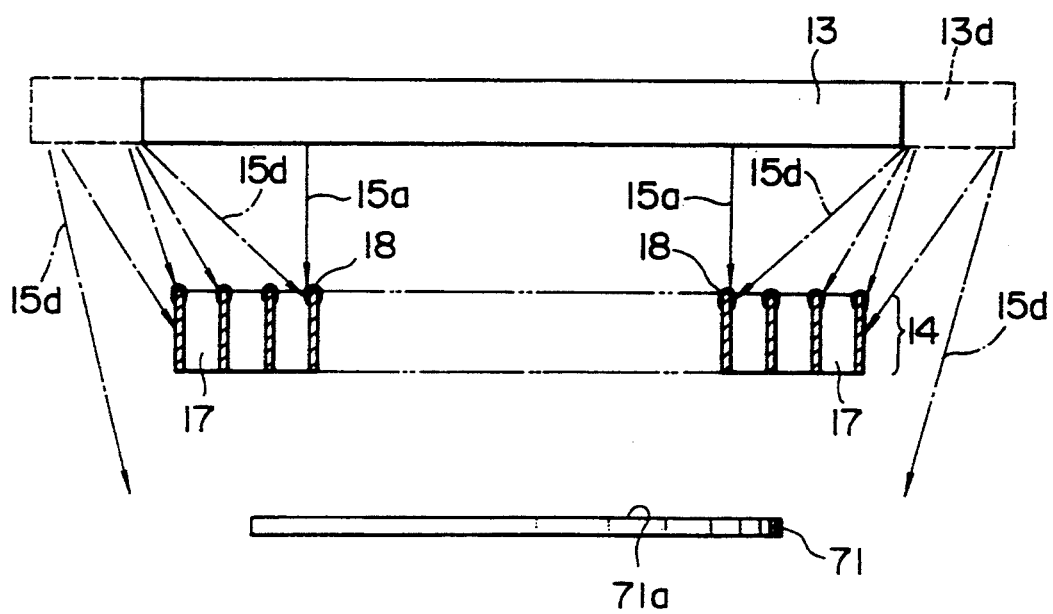

MAGNETRON SPUTTERING APPARATUS

This application is a continuation-in-part continuation of application Ser. No. 07/896,366, filed Jun. 10, 1992, now abandoned.

BACKGROUND OF THE INVENTION

1. Field of the Invention

The present invention relates to a magnetron sputtering apparatus for forming a metal film or an insulating film in fabricating a thin film semiconductor device.

2. Description of the Prior Art

Metal films of a thin film semiconductor device, in general, are formed by a magnetron sputtering apparatus. The magnetron sputtering apparatus induces ions of a reactive gas to impinge against a target and thus cause particles of the material from which the target is formed to be ejected therefrom and be deposited in a film over the surface of a wafer. The diameter of the target must be twice that of the wafer or greater and the peripheral portion of the target must be eroded more rapidly than the central portion of the same in order to form a film having a uniform thickness. When such a target larger than the wafer is used, most particles of the target fall on the surface of the wafer obliquely. Therefore, a drawback is encountered in that the particles of the target are unable to reach the bottom portions of a contact holes having a high aspect ratio and hence it is difficult to form a satisfactory film over the surface of the contact hole.

As shown in FIG. 6, a prior art magnetron sputtering apparatus 60 is provided with a particle interceptor 63 disposed between a wafer holder 61 for holding a wafer 71 thereon, and a target 62. The particle interceptor 63 is constructed by assembling a plurality of shading plates 64 in a grid so as to form through holes 65 through which particles of the target 62 travel. Most particles ejected from the surface 62a of the target 62 and traveling obliquely to the surface 71a of the wafer 71 held on the wafer holder 61 are arrested by the particle interceptor 63. Consequently, only the particles traveling in directions inclined at small angles to the normal to the surface 71a of the wafer 71 are able to pass through the through holes 65, to reach the surface 71a of the wafer 71 and to deposit in a satisfactory film, not shown, over the surface of the bottom portion of a contact hole, not shown, formed in the wafer 71.

However, problems arise in arresting the particles traveling obliquely to the surface 71a of the wafer 71 by the particle interceptor 63; most of the particles 64 traveling obliquely to the surface 71a of the wafer 71 deposit on the particle interceptor 63 as shown in FIG. 7. The particles 64 ejected from the peripheral portion 62a of the target 62 of a diameter 1.4 times the diameter of the wafer 71 or greater, in particular, are intercepted by the particle interceptor 63 and unable to reach the surface 71a of the wafer 71, and, consequently, the amount of the particles 64 of the target 62 that reach the surface 71a of the wafer 71 is reduced, reducing the availability of the target 62.

The particles 64 which traveled obliquely and which are arrested by the particle interceptor 63, accumulate in thick deposits 66 over the surface of the through holes 65 to narrow the same or, in the worst case, the through holes 65 are clogged with the deposits 66. Consequently, the particles 64 of the target 62 are unable to reach the surface 71a of the wafer 71 sufficiently and it is impossible to form a thick film efficiently over the surface 71a of the wafer Furthermore, the thickness of a portion of the film formed in a region of the surface 71a of the wafer 71 covered by the shade of the particle interceptor 63 formed on the surface 71a by the orthogonal projection of the particle interceptor 63 is smaller than that of other portions of the film formed in regions of the surface 71a other than the region covered by the shade of the particle interceptor 63.

SUMMARY OF THE INVENTION

It is an object of the present invention to provide a magnetron sputtering apparatus capable of efficiently using a target and of forming a film having high covering power in a highly uniform thickness.

A magnetron sputtering apparatus in one aspect of the present invention comprises a wafer holder for holding a wafer, and a particle interceptor disposed between the wafer holder and a target to intercept some of particles ejected from the target, wherein the diameter of the target is not smaller than that of the wafer and not greater than a value 1.4 times that of the wafer.

A magnetron sputtering apparatus in another aspect of the present invention comprises a wafer holder for holding a wafer, and a particle interceptor disposed between the wafer holder and a target to intercept some of particles ejected from the target, wherein the particle interceptor is moved in parallel to the surface of a wafer held on the wafer holder by driving means so that the shade thereof formed by the orthogonal projection of the particle interceptor moves on the surface of the wafer.

When the diameter of the target is not smaller than that of the wafer and not greater than a value 1.4 times that of the wafer, particles ejected from the target have at least a possibility of reaching the surface of the wafer and no particle has no possibility of reaching the surface of the wafer at all and has only a possibility of adhering to the particle interceptor. Accordingly, the amount of particles that deposit on the particle interceptor is reduced and hence the particles are able to reach surface of the wafer easily.

Since the particle interceptor is moved in parallel to the surface of the wafer so that the shade thereof formed on the surface of the wafer by the orthogonal projection thereof moves on the surface of the wafer, no region of the surface of the wafer is shaded always by the particle interceptor, so that the particles of the target are distributed uniformly over the surface of the wafer.

BRIEF DESCRIPTION OF THE DRAWINGS

The above and other objects, features and advantages of the present invention will become more apparent form the following description taken in connection with the accompanying drawings, in which:

FIG. 2 is a sectional view of assistance in explaining reasons for limiting the diameter of a target to a value in a specific range;

FIG. 3 is a sectional view of assistance in explaining reasons for limiting the diameter of a target to a value in a specific range;

DETAILED DESCRIPTION OF THE PREFERRED EMBODIMENTS

First Embodiment

Figure 1:
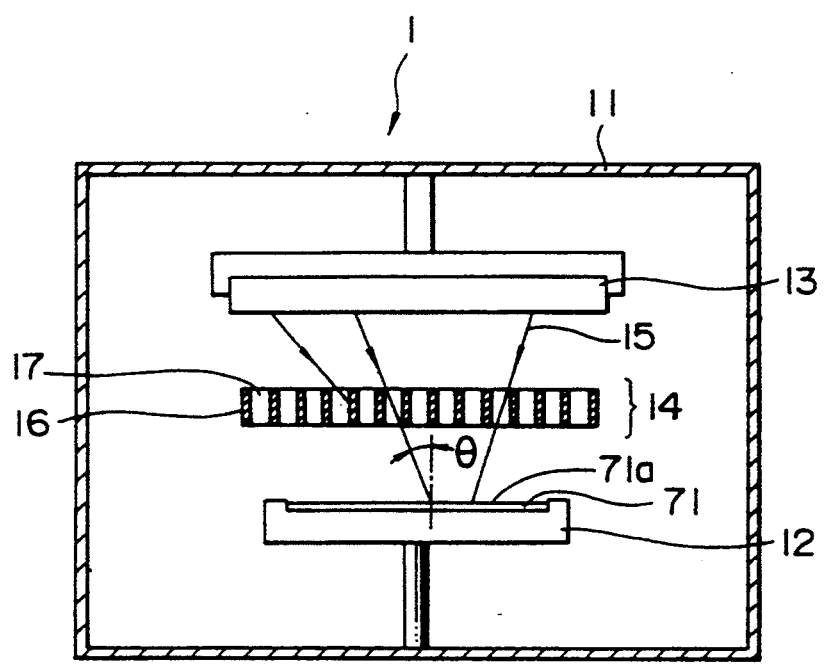
FIG. 1 is a schematic sectional view of a magnetron sputtering apparatus in a first embodiment according to the present invention.

Referring to FIG. 1, a magnetron sputtering apparatus in a first embodiment according to the present invention has a sputtering chamber 11 and a wafer holder 12 disposed within the sputtering chamber 11. A target 13 is disposed opposite to the wafer holder 12, and a particle interceptor 14 is disposed between the wafer holder 12 and the target 13. The particle interceptor 14 is formed by assembling shading plates 16 in a grid so as to form a plurality of holes 17 of 1 cm square in sectional area and 2 cm in length and has a diameter approximately equal to that of the target 13. The particle interceptor 14 intercepts some of particles 15 ejected from the target 13 and traveling in directions oblique to the surface 71a of the wafer 71 held on the wafer holder 12, for example, those traveling in directions inclined at angles e greater than about 30° to the normal to the surface 71a of the wafer 71.

The diameter of the target 13 is not smaller than that of the wafer 71 and not greater than a value 1.4 times that of the wafer 71. If the diameter of the target 13 is smaller than that of the wafer 71, most particles 15b ejected from the target 13 and traveling toward the peripheral region 71b of the surface 71a of the wafer 71 are intercepted by the particle interceptor 14 because the directions of travel of these particles 15b are oblique to the normal to the surface 71a of the wafer 71 as shown in FIG. 2. Consequently, the thickness of a portion of a film, not shown, formed over the peripheral region of the surface 71a of the wafer 71 is very small as compared with that of a portion of the film formed over the central region of the surface 71a of the wafer 71. Accordingly, the diameter of the target 13 must be not smaller than that of the wafer 71 as indicated by broken lines in FIG. 2 so that some particles 15c are able to travel in directions normal to the surface 71a of the wafer 71 as indicated by alternate long and short dash lines in FIG. 2. If the diameter of the target 13 is greater than a value 1.4 times that of the wafer 71, particles 15d ejected from the peripheral portion 13d of the target 13 indicated by broken lines in FIG. 3 outside a central portion of the target 13 of a diameter 1.4 times that of the wafer 71 travel in directions indicated by alternate long and short dash lines in FIG. 3 and these particles 15d are intercepted by the particle interceptor 14 or unable to fall on the surface 71a of the wafer 71. These particles 15d adhere to and grow into thick deposits 18 on the particle interceptor 14 to reduce the sectional area of the holes 17 of the particle interceptor 14 and to obstruct the travel of the particles 15a toward the surface 71a of the wafer 71. Accordingly, the diameter of the target 13 must be not smaller than that of the wafer 71 and not greater than a value 1.4 times that of the wafer 71.

Generally, the distance between the target 13 and the wafer 71 is several centimeters and the upper limit of the angle of incidence of the particles 15 on the surface 71a of the wafer 71 is on the order of 30°. Therefore, when the distance between the target 13 and the wafer 71 is 60 mm, an appropriate diameter of the target 13 is about a value not less than that of the wafer 71 and not greater than a value 1.4 times that of the wafer 71 if the diameter of the wafer 71 is six inches, and about a value not smaller than that of the wafer 71 and not greater than a value 1.3 times that of the wafer if the diameter of the wafer 71 is eight inches.

A process of forming an aluminum film over the surface 71a of the wafer 71 by the magnetron sputtering apparatus 1 using a target 13 of aluminum will be described hereinafter. Argon (Ar) gas, i.e., the reactive gas, is supplied at a predetermined flow rate into the sputtering chamber 11 and the Ar gas is discharged at a predetermined discharge rate from the sputtering chamber to maintain the pressure of the Ar gas within the sputtering chamber 11 at 0.4 Pa. A high voltage is applied across the target 13 and the wafer holder 12 to produce a plasma in the space between the wafer holder 12 and the target 13 to ionize the Ar gas. Then, Ar ions impinge on the target 13 to eject particles 15 from the target 13. Most of the particles 15 ejected from the target 13 travel through the holes 17 of the particle interceptor 14 and deposit on the surface 71a of a wafer 71 held on the wafer holder 12.

Since the diameter of the target 13 is not less than that of the wafer 71 and not greater than a value 1.4 times that of the wafer 71, most of the particles 15 ejected from the target 13 are able to reach the surface 71a of the wafer 71. The amount of the particles 15 which are intercepted by and deposit on the particle interceptor 14 is very small as compared with that of the particles intercepted by and deposited on the particle interceptor 63 of the prior art magnetron sputtering apparatus 60. Accordingly, the target 13 is used highly efficiently, the holes 17 of the particle interceptor 14 are not clogged with the particles 15 and the particles 15 are able to reach the surface 71a of the wafer 71 easily.

Since the angle $\theta$ of incidence of the particles 15 on the surface 71a of the wafer 71 is not greater than about 30°, the particles 15 are able to reach the bottom surface of contact holes of a high aspect ratio formed in the wafer 71 to form satisfactory aluminum films over the surfaces of the contact holes. The aluminum film formed by the magnetron sputtering apparatus has a uniform thickness varying within a standard thickness tolerance of, for example, ±5%.

Since the magnetron sputtering apparatus uses the target 13 of a diameter smaller than that of the target used by the prior art magnetron sputtering apparatus, the sputtering chamber 11 may be smaller than that of the prior art magnetron sputtering apparatus and hence the magnetron sputtering apparatus 1 of the present invention can be constructed in a size smaller than that of the prior art magnetron sputtering apparatus of the same capacity.

The magnetron sputtering apparatus 1 using such a target as the target 13 may be provided with a particle interceptor of a construction different from that of the particle interceptor 14, for example, a particle interceptor of a honeycomb construction having holes having a hexagonal cross section or a particle interceptor of a concentric cylinder construction formed by connecting a plurality of concentric shading cylinders by a plurality of radial plates.

Since the sectional area of the holes in the peripheral portion of the particle interceptor of a concentric construction is greater than that of the holes in the central portion of the same, some of the particles traveling in directions inclined at angles, for example, in the range of 30° to 40° of the normal to the surface 71a of the wafer 71, as well as those traveling in directions inclined at angles not greater than about 30° to the normal to the surface 71a of .the wafer 71, are able to pass through the holes in the peripheral portion of the particle interceptor. Accordingly, the problem of the thickness of a portion of the film formed over the peripheral region of the surface 71a of the wafer 71 being smaller than that of a portion of the same formed over the central region of the surface 71a of the wafer 71 is solved and the uniformity of the thickness of the film is further improved.

Second Embodiment

A magnetron sputtering apparatus in a second embodiment according to the present invention is capable of forming a film having a thickness of further improved uniformity.

Figure 4:
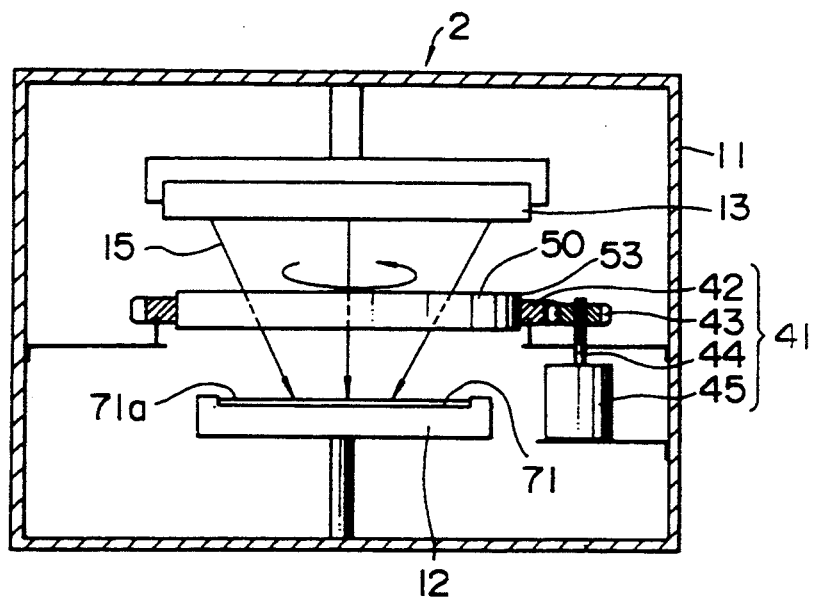
FIG. 4 is a schematic sectional view of a magnetron sputtering apparatus in a second embodiment according to the present invention.

Referring to FIG. 4, a magnetron sputtering apparatus 2 in the second embodiment has a wafer holder 12 disposed within a sputtering chamber 11, a particle interceptor 50 disposed between the wafer holder 12 and a target 13 disposed opposite to the wafer holder 12, and a driving unit 41 held on a wall defining the sputtering chamber 11. The driving unit 41 comprises a motor 45, a driving gear 43 mounted on the output shaft 44 of the motor 43, and a driven gear 42 formed integrally with the outermost portion of a shading plate 51 forming the particle interceptor 50 and engaging the driving gear 43. The driven gear 42 is supported for rotation together with the particle interceptor 50 in the direction of the arrow a (or the reverse direction) about the axis Z (FIG. 5) of the particle interceptor 50 by a support 46 provided within the sputtering chamber 11.

Figure 5:
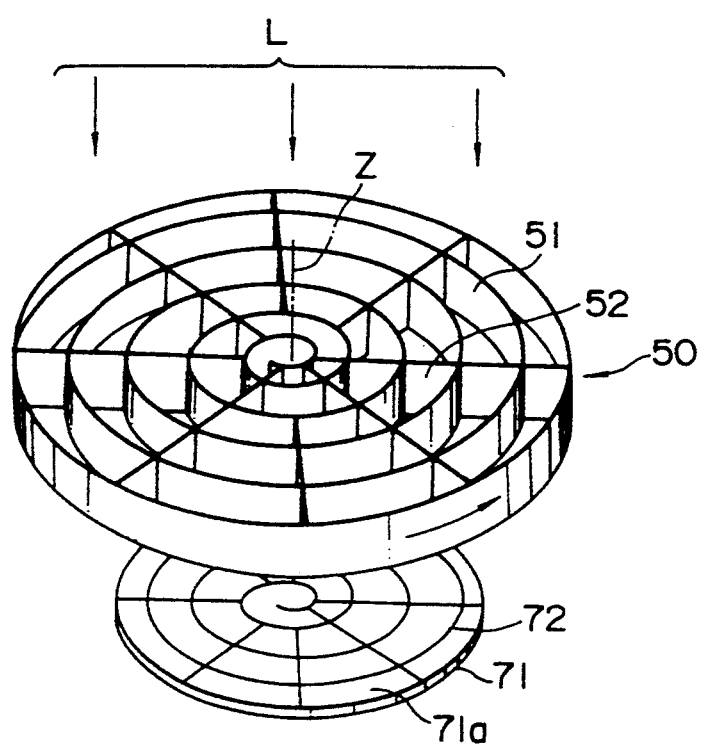
FIG. 5 is a perspective view of a particle interceptor, for, according to the second embodiment which depicts shadowing effect provided thereby.
Figure 6:
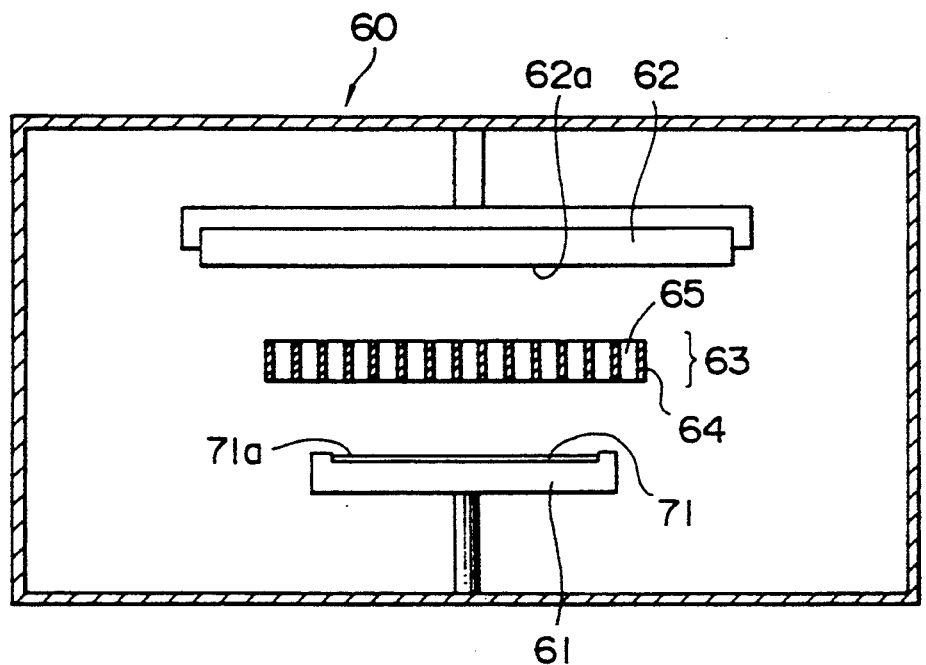
FIG. 6 is a schematic sectional view of a prior art magnetron sputtering apparatus; discussed in the opening paragraphs of the disclosure
Figure 7:
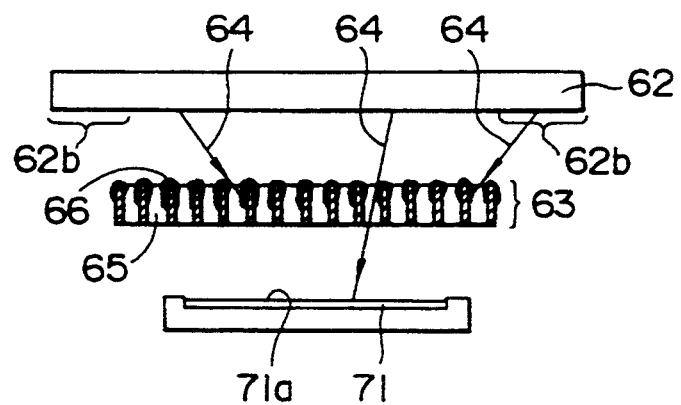
FIG. 7 is a sectional view depicting the problems encountered with the prior art magnetron sputtering apparatus shown in FIG. 6.

As shown in FIG. 5, the particle interceptor 50 is formed by winding the shading plate 51 in a spiral shape and connecting the coils of the shading plate 51 using radial plates 52. The arrangement has a center hole.

When the particle interceptor 50 is driven by the driving unit 41 for rotation about the axis Z in the direction of the arrow a, the shadow 72 of the particle interceptor 50 formed by the orthogonal projection of the particle interceptor 50 on the surface 71a of a wafer 71 held on the wafer holder 12 rotates in the direction of the arrow a. Accordingly, the position of the shadow 72 relative to the surface 71a of the wafer 71 changes continuously.

In forming an aluminum film over the surface 71a of the wafer 71 using a magnetron sputtering apparatus 2 and a target 13 of aluminum, a plasma is produced in the space between the wafer holder 12 and the target 13 in the same manner as that employed in forming the aluminum film in the first embodiment. As a result, Ar ions impinge on the target 13 to induce ejection of particles from the target 13. The particles travel through the holes of the particle interceptor 50, fall on the surface 71a of the wafer 71 and deposit in an aluminum film.

During the sputtering process, the particle interceptor 50 is rotated about its axis Z in the direction of the arrow a by the driving unit 41, so that the position of the shadow 72 of the particle interceptor 50 relative to the surface 71a of the wafer 71 changes continuously to expose the entire region of the surface 71a of the wafer 71 evenly to the particles. Thus, the aluminum film can be formed in a uniform thickness.

The driving unit 41 of the sputtering apparatus 2 need not necessarily be of the foregoing type of gear mechanism, but may be a driving unit of any suitable transmission mechanism capable of rotating the particle interceptor 50, such as a driving unit of a belt-and-pulley mechanism or driving unit of a chain-and-sprocket mechanism. The particle interceptor 50 need not necessarily be of the foregoing construction, but may by of any suitable construction capable of being rotated and of evenly distributing particles of the target over the surface 71a of the wafer 71.

The uniformity of the film in thickness can be improved by moving the particle interceptor 50 back and forth and from side to side in a plane parallel to the surface 71a of the wafer 71 instead of rotating the same.

As is apparent from the foregoing description, since the magnetron sputtering apparatus according to the present invention uses a target of a diameter not smaller than that of the wafer and not greater than 1.4 times that of the wafer, only a few particles of the target travel in directions oblique to the normal to the surface of the wafer, only few particles of the target accumulate on the particle interceptor, the holes of the particle interceptor do not become clogged, the target can be efficiently used and hence a film can be efficiently formed.

Since the particle interceptor in accordance with the second embodiment is moved by the driving unit, the surface of the wafer is exposed uniformly to the incoming particles of the target and the particles are distributed substantially evenly over the surface of the wafer to form a film of a uniform thickness over the surface of the wafer.

Although the invention has been described in its preferred forms with a certain degree of particularity, obviously many changes and variations are possible therein. It is therefore to be understood that the present invention may be practiced otherwise than as specifically described herein without departing from the spirit and scope thereof.

What is claimed is:

1. A magnetron sputtering apparatus comprising:
   a wafer holder for holding a wafer thereon;
   a target holder for holding a target opposite to said wafer holder;
   an substantially circular particle interceptor for intercepting particles which are ejected from said target, said particle interceptor being disposed between said wafer holder and said target holder, said particle interceptor comprising a single spiral shaped coil and radial plates which each connect with said spiral shaped coil at a plurality of locations and which form a plurality of holes extending from a central portion of said particle interceptor to a peripheral portion of said particle interceptor, the holes in said peripheral portion having a greater cross-sectional area than the holes in said central portion; and
   means for rotating said particle interceptor in a plane parallel to the surface of said wafer and about an axis which passes through a center of the substantially circular particle interceptor so that a shadow, formed by orthogonal projections of said particle interceptor on the surface of said wafer, is moved over the surface of said wafer;

wherein said target has a diameter which is not smaller than that of said wafer and not greater than a value 1.4 times the diameter of said wafer.

2. A magnetron sputtering apparatus according to claim 1, wherein said means for rotating induces, continuous rotation of said particle interceptor in one rotational direction.

* * * * *